US011637105B2

(12) United States Patent
Sugioka et al.

(10) Patent No.: US 11,637,105 B2
(45) Date of Patent: Apr. 25, 2023

(54) APPARATUS COMPRISING COMPENSATION CAPACITORS

(71) Applicant: Micron Technology, Inc., Boise, ID (US)

(72) Inventors: Shigeru Sugioka, Tokyo (JP); Keizo Kawakita, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/449,583

(22) Filed: Sep. 30, 2021

(65) Prior Publication Data

US 2022/0020750 A1  Jan. 20, 2022

Related U.S. Application Data

(63) Continuation of application No. 16/390,728, filed on Apr. 22, 2019, now Pat. No. 11,158,640.

(51) Int. Cl.
*H01L 27/108* (2006.01)
*H01L 23/522* (2006.01)
(Continued)

(52) U.S. Cl.
CPC .... *H01L 27/10829* (2013.01); *H01L 23/5222* (2013.01); *H01L 23/642* (2013.01);
(Continued)

(58) Field of Classification Search
CPC ........... H01L 27/10829; H01L 27/1087; H01L 27/10855; H01L 27/10808; H01L 27/10805; H01L 27/1085; H01L 28/40;
H01L 28/90; H01L 28/91; H01L 28/92; H01L 28/86; H01L 28/87; H01L 28/88; H01L 23/5223; H01L 23/642
See application file for complete search history.

(56) References Cited

U.S. PATENT DOCUMENTS 7,705,677 B2  4/2010  Forbes et al.
8,637,376 B2  1/2014  Sugioka et al.
(Continued)

*Primary Examiner* — Omar F Mojaddedi
(74) *Attorney, Agent, or Firm* — TraskBritt

(57) ABSTRACT

An apparatus comprising first and second interconnections spaced apart from one another, an interlayer insulating material over the first and second interconnections, first and second contacts in the interlayer insulating material and spaced apart from one another, third and fourth interconnections over the interlayer insulating material and spaced apart from one another, and compensation capacitors in a capacitor region. The third interconnections are coupled with the first interconnections through the first contacts and the fourth interconnections are coupled with the second interconnections through the second contacts. The compensation capacitors comprise lower electrodes over the interlayer insulating material, dielectric materials over the lower electrodes, and upper electrodes over the dielectric materials. The lower electrodes comprise edge portions in contact with the second contacts. The third interconnections are elongated over the dielectric materials and are configured to provide elongated portions as the upper electrodes of the compensation capacitors. Related methods, memory devices, and electronic systems are disclosed.

20 Claims, 10 Drawing Sheets

(51) Int. Cl.
   *H01L 23/64*      (2006.01)
   *H01L 23/52*      (2006.01)
   *H01L 49/02*      (2006.01)

(52) U.S. Cl.
   CPC .......... *H01L 27/1087* (2013.01); *H01L 28/40* (2013.01); *H01L 28/86* (2013.01); *H01L 28/90* (2013.01)

(56) References Cited

U.S. PATENT DOCUMENTS

| | | |
|---|---|---|
| 8,737,154 B2 | 5/2014 | Pan |
| 9,577,025 B2 | 2/2017 | Gu et al. |
| 10,141,932 B1 | 11/2018 | Sato |
| 2003/0049885 A1* | 3/2003 | Iijima .................. H01L 23/642 438/106 |
| 2010/0224960 A1* | 9/2010 | Fischer .................. H01L 28/86 257/532 |
| 2012/0056298 A1* | 3/2012 | Kuroki ................ H01L 23/5223 257/532 |
| 2014/0264748 A1* | 9/2014 | Fujiwara ............. H01L 23/5223 257/532 |
| 2014/0374877 A1* | 12/2014 | Oh ........................ H01L 23/642 257/532 |
| 2015/0311210 A1 | 10/2015 | Sugioka |
| 2018/0130739 A1 | 5/2018 | Miura et al. |
| 2018/0247998 A1 | 8/2018 | Kondo et al. |
| 2018/0254245 A1 | 9/2018 | Miura et al. |
| 2018/0337123 A1 | 11/2018 | Lai et al. |
| 2019/0057726 A1 | 2/2019 | Nishizaki |
| 2019/0058109 A1* | 2/2019 | Chen .................. H01L 23/5384 |

\* cited by examiner

APPARATUS COMPRISING COMPENSATION CAPACITORS

CROSS-REFERENCE TO RELATED APPLICATION

This application is a continuation of U.S. patent application Ser. No. 16/390,728, filed Apr. 22, 2019, now U.S. Pat. No. 11,158,640, issued Oct. 26, 2021, the disclosure of which is hereby incorporated herein in its entirety by this reference.

TECHNICAL FIELD

Embodiments disclosed herein relate to semiconductor devices and semiconductor device fabrication. More particularly, embodiments of the disclosure relate to apparatus comprising integrated redistribution layers and compensation capacitors and to related methods, memory devices, and electronic systems.

BACKGROUND

Semiconductor device designers often desire to increase the level of integration or density of features (e.g., components) within a semiconductor device by reducing the dimensions of the individual features and by reducing the separation distance between neighboring features. In addition, semiconductor device designers often desire to design architectures that are not only compact, but offer performance advantages, as well as simplified designs. Reducing the dimensions and spacing of semiconductor device features places ever increasing demands on the methods used to form the semiconductor device features.

A relatively common semiconductor device is a memory device, which may include a memory array having a number of memory cells arranged in a grid pattern. One type of memory cell is a dynamic random access memory (DRAM) device, which is a volatile memory device that may lose a stored state over time unless the DRAM device is periodically refreshed by an external power supply. In the simplest design configuration, a DRAM cell includes one access device (e.g., a transistor) and one storage device (e.g., a capacitor). Modern applications for memory devices may utilize vast numbers of DRAM unit cells, arranged in an array of rows and columns. The DRAM cells are electrically accessible through digit lines and word lines arranged along the rows and columns of the array. High data reliability, high speed of memory access, reduced chip size, and reduced power consumption are desirable performance properties of DRAM devices.

In the DRAM device, power supply lines provide power from an external power source to components (e.g., transistors, capacitors, etc.) of the DRAM device. The power supply lines are usually arranged throughout the DRAM device as metal layers. The resistivity of the metal used dissipates power and generates heat as the power is transmitted from the power supply. The power dissipation and heat generation increase the farther the power travels along the power supply lines. To reduce consequences of the power dissipation and heat generation, a so-called "integrated" or "inline" redistribution layer (iRDL) has been used in DRAM devices. The iRDL is formed of a low resistivity metal and provides power to certain locations in the DRAM device. The iRDL may be located as an uppermost material of the DRAM device and is electrically connected to lower conductive materials of the DRAM device through contact plugs, which provide conductive pathways between the power supply lines in the iRDL and the underlying conductive materials. For instance, the iRDL may function as a metal 4 (M4) material that provides a conductive pathway to a metal 3 (M3) material. The iRDL may be located in dedicated portions of the DRAM device to prevent interference (e.g., noise) with control signals or other wiring. However, forming the iRDL in dedicated portions results in increased chip size and power consumption of the DRAM device.

Metal-oxide-semiconductor (MOS) capacitors or container capacitors have been used as so-called "compensation capacitors" in DRAM devices as noise countermeasures. However, the trend toward decreasing the size of DRAM devices had led to a decreased footprint available for the MOS capacitors or container capacitors. To form the MOS or container capacitors according to conventional techniques, the materials are deposited in small openings. The small size of the openings places ever increasing demands on the methods used to form the DRAM devices containing these capacitors.

DETAILED DESCRIPTION

Figure 1:
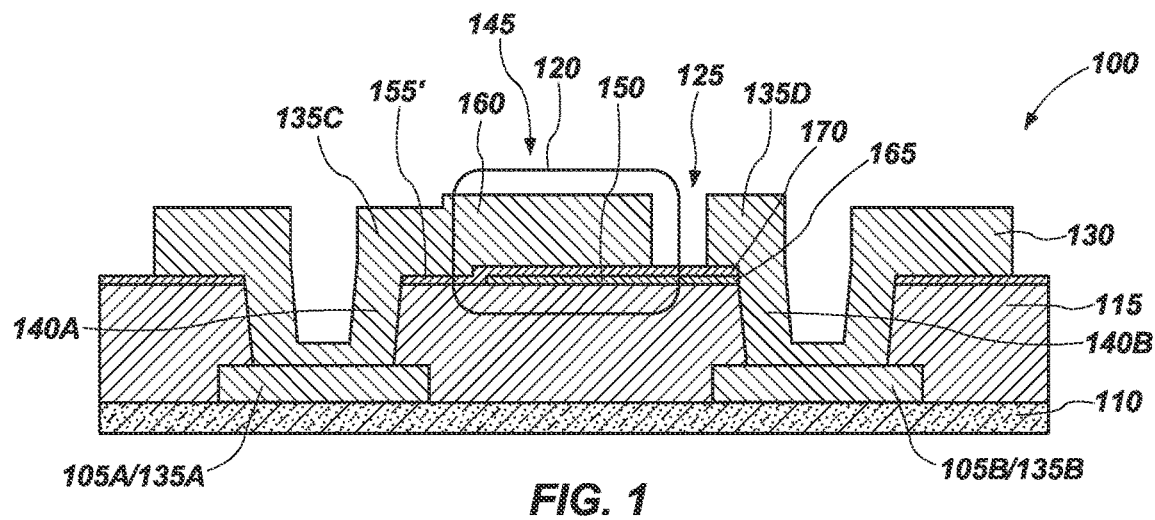
FIGS. 1-5 are cross-sectional views showing semiconductor devices according to embodiments of the disclosure.

A semiconductor device (e.g., an apparatus) that includes a capacitor (e.g., a compensation capacitor) in a wiring region of the semiconductor device is disclosed. By including the compensation capacitor in a wiring structure in the wiring region, the compensation capacitor is formed at desired small dimensions without increasing the footprint of the semiconductor device. The semiconductor device is a multilevel wiring structure and includes the compensation capacitor positioned between a so-called "integrated" or "inline" redistribution layer (iRDL) and an underlying wiring structure of the semiconductor device. The iRDL is formed in the semiconductor device before the assembly process. The compensation capacitor reduces noise associated with high frequency signals and is formed at the desired small dimensions by positioning the compensation capacitor between the iRDL and another wiring structure.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "compensation capacitor" means and includes a capacitor configured and positioned to reduce or prevent oscillation and noise, and to stabilize an output voltage. The compensation capacitor provides negative feedback at high frequencies to prevent oscillation. The compensation capacitor is positioned in a capacitor region, between the iRDL and the underlying wiring structure.

As used herein, the term "configured" refers to a size, shape, material composition, and arrangement of one or more of at least one structure and at least one apparatus facilitating operation of one or more of the structure and the apparatus in a pre-determined way.

As used herein, the term "contact" means and includes a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be Mored.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As shown in FIG. 1, a semiconductor device 100 includes, over a base material (not shown), first and second wiring structures 105A and 105B (e.g., first and second interconnections 135A, 135B), insulating material 110, interlayer insulating material 115, a compensation capacitor 120, and an iRDL 130 having third and fourth interconnections 135C and 135D separated from each other by an opening 125. The wiring structures 105A and 105B are electrically connected, respectively, to the interconnections 135C and 135D (e.g., the iRDL 130) through conductive contacts 140A and 140B. In some embodiments, the contacts 140A and 140B are formed simultaneously with the iRDL 130. The compensation capacitor 120 is provided in a capacitor region 145 on the interlayer insulating material 115 between the interconnections 135C and 135D. The compensation capacitor 120 includes a lower electrode 150 over the capacitor region 145, a patterned dielectric material 155' over the lower electrode 150, and an upper electrode 160 over the patterned dielectric material 155'. The interconnections 135 of the iRDL 130 are elongated over the patterned dielectric material 155' to function as the upper electrode 160. The iRDL 130 may be located as an uppermost material of the semiconductor device 100 and is electrically connected to underlying conductive materials (e.g., the wiring structures 105) of the semiconductor device 100 through, for example, contact plugs, which provide conductive pathways between the iRDL 130 and the underlying conductive materials. The lower electrode 150 is substantially located in the capacitor region 145 except that a lower edge 165 is in contact with the second contacts 140B outside the capacitor region 145.

The patterned dielectric material 155' is in contact with substantially all of a top surface of the interlayer insulating material 115. A lower edge 170 of the dielectric material is also in contact with the second contacts 140B. Thus, the interconnections 135C and 135D each formed as the iRDL 130 are coupled, respectively, to the upper and lower electrodes 160 and 150 through the contacts 140A and 140B.

Figure 2:
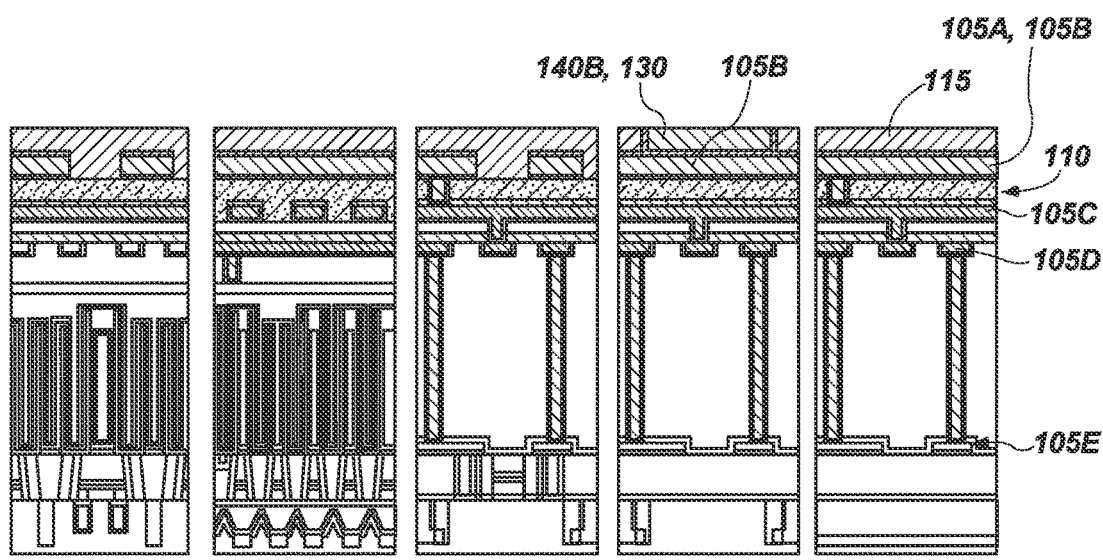

Multiple levels of wiring structures 105 may be present in the semiconductor device 100, with the iRDL 130 located above, for example, the underlying wiring structures 105A, 105B. While FIG. 1 shows two levels of wiring structures 105 (i.e., wiring structure 105A/105B, iRDL 130), additional wiring structures (e.g., 105C, 105D, 105E) may be below the wiring structure 105A/105B, as shown in FIG. 2. In this example, four-level wiring structures (105A/105B, 105C, 105D, 105E), the interlayer insulating material 115, and contacts 140 are identified in FIG. 2. Each level of wiring structure 105 includes an electrically conductive material that is isolated from electrically conductive materials of other levels of wiring structures 105 by an insulating material, such as the interlayer insulating material 115 or the insulating material 110. Each level of wiring structure 105 is electrically coupled to another level of wiring structure 105 by the contacts 140. The additional wiring structures 105B, 105C may be positioned below the wiring structure 105A and the iRDL 130. The electrically conductive material may be a high conductivity metal material, a middle conductivity metal material, or a low conductivity metal material depending on desired performance properties (e.g., capacitance) of the semiconductor device 100. The electrically conductive material may be a metal, a metal alloy, a metal-containing material, a conductively-doped semiconductor material, or a combination thereof. The electrically conductive material may include, but is not limited to, aluminum, copper, gold, iridium, iridium oxide, molybdenum, molybdenum nitride, nickel, platinum, ruthenium, ruthenium oxide, ruthenium titanium nitride, silver, tantalum, tantalum nitride, tantalum silicide, titanium, titanium nitride, titanium silicide, titanium aluminum nitride, titanium silicon nitride, tungsten, tungsten nitride, alloys thereof, combinations thereof, or conductively doped silicon.

By way of example only, a lowermost (metal 0) wiring structure 105E at the lowermost-level may be a low conductivity metal (e.g., tungsten), a middle (metal 1) wiring structure 105D at a first-level may be a high conductivity metal (e.g., copper), a middle (metal 2) wiring structure 105C at a second-level may be a high conductivity metal (e.g., copper), and a middle (metal 3) wiring structure 105A/105B at a third-level may be a middle conductivity metal (e.g., aluminum). In addition, the iRDL 130 is provided at the uppermost-level. The iRDL 130 may contain aluminum and may be formed at a sufficient width and sufficient thickness to enable low resistivity.

The interlayer insulating material 115 may be a dielectric material including, but not limited to, silicon oxide or silicon nitride. A thickness of the interlayer insulating material 115 may be sufficient to electrically isolate electrically conductive materials from one another.

The lower electrode 150 of the compensation capacitor 120 is formed from a lower electrode material that is electrically conductive, such as one of the materials above. In some embodiments, the lower electrode 150 is formed of titanium nitride. The dielectric material 155 exhibits a dielectric constant of greater than or equal to about 20. The dielectric material 155 may, for example, be a high-k dielectric material including, but not limited to, one or more of a hafnium oxide (HfO$_x$, such as HfO$_2$); a zinc oxide (ZrO$_x$, such as $ZrO_2$); an aluminum oxide ($AlO_x$, such as $Al_2O_3$); a stacked structure of amorphous $ZrO_x$, amorphous $AlO_x$, $ZrO_x$ and $AlO_x$; polysilsesquioxane (PSQ); barium strontium titanate (BST); lead ziconate titanate (PZT); lead lanthanum zirconate titanate (PLZT); lead scandium tantalate (PST); strontium bismuth tantalate (SBT); barium bismuth tantalate (BBT); barium titanate (BT); strontium titanate (ST); and tantalum pentoxide ($Ta_2O_5$). The stacked structure may include alternating amorphous $AlO_x$ and crystalline $ZrO_x$ materials, a thin layer of the amorphous $AlO_x$ material between two thick layers of the crystalline amorphous $ZrO_x$ material, or a thick layer of the crystalline amorphous $ZrO_x$ material over a thin layer of the amorphous $AlO_x$ material. The upper electrode 160 is formed from an upper electrode material that is electrically conductive, such as one of the materials above. In some embodiments, the upper electrode 160 is formed as a part of the iRDL 130 and includes a combination of titanium-aluminum-titanium nitride (Ti—Al—TiN). The electrically conductive material that forms the upper electrode 160 also forms the iRDL 130.

As shown in FIG. 1, the semiconductor device 100 includes a first wiring structure 105A and a second wiring structure 105B spaced apart from the first wiring structure 105A, and a first contact 140A and a second contact 140B spaced apart from the first contact 140A. The first and second wiring structures 105A, 105B (e.g., first and second interconnections 135A, 135B) are in the interlayer insulating material 115 and are separated from one another by the interlayer insulating material 115. The first and second wiring structures 105A, 105B may be formed from the same electrically conductive material as one another or from different electrically conductive materials. The interlayer insulating material 115 is located over and between the first and second wiring structures 105A, 105B. The first contact 140A and the second contact 140B are located on sidewalls of the interlayer insulating material 115 between the first and second contacts 140A, 140B and the first and second interconnections 135A, 135B. The first and second contacts 140A, 140B may be formed from the same electrically conductive material as one another or from different electrically conductive materials. The first contact 140A and the second contact 140B may be configured, for example, as contact plugs. The first contact 140A and the second contact 140B are in the interlayer insulating material 115 and operably couple the wiring structures 105A, 105B to the compensation capacitor 120. The lower edge 165 of the lower electrode 150 and the lower edge 170 of the patterned dielectric material 155' are in contact with the second contact 140B.

The third interconnection 135C and the fourth interconnection 135D of the semiconductor device 100 are spaced apart from one another and are located over the interlayer insulating material 115. The third interconnection 135C is coupled to the first interconnection 135A through the first contact 140A and the fourth interconnection 135D is coupled to the second interconnection 135B through the second contact 140B. The third and fourth interconnections 135C, 135D may be formed from the same electrically conductive material as one another or from different electrically conductive materials. The third and fourth interconnections 135C, 135D form the iRDL 130. A portion of the third interconnection 135C is elongated over the patterned dielectric material 155' of the compensation capacitor 120 and functions as the upper electrode 160 of the compensation capacitor 120. The upper electrode 160 is separated from (e.g., does not contact) the fourth interconnection 135D of the iRDL 130 by opening 125. The electrically conductive material of the third interconnection 135C may be the same as the electrically conductive material of the first contact 140A, and the electrically conductive material of the fourth interconnection 135D may be the same as the electrically conductive material of the second contact 140B. The electrically conductive material of the third interconnection 135C may be the same as the electrically conductive material of the first contact 140A.

Figure 3:
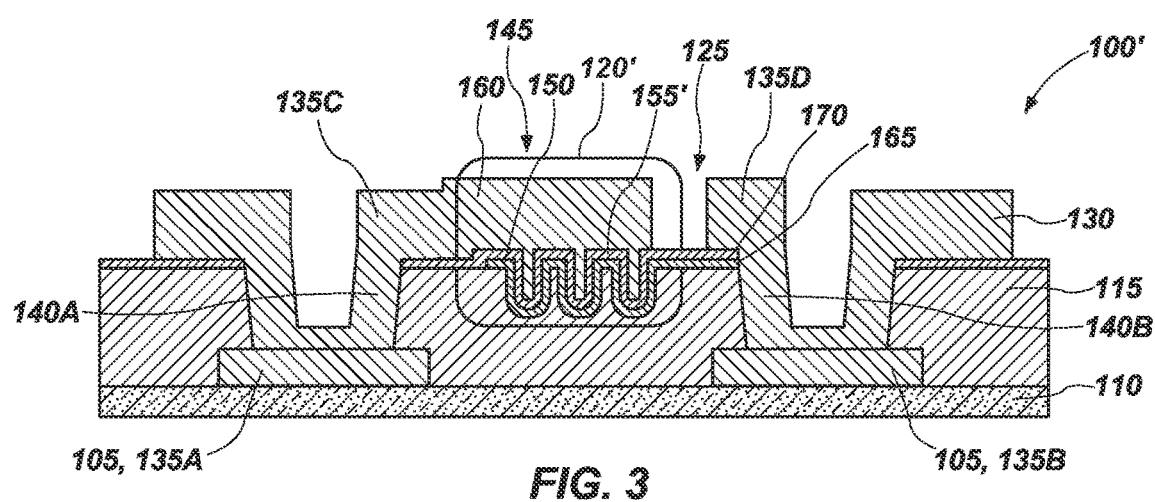

To increase a surface area of the compensation capacitor 120, the lower electrode 150, the patterned dielectric material 155', and the upper electrode 160 may be contained in capacitor trenches in the interlayer insulating material 115. A semiconductor device 100' with the higher surface area compensation capacitor 120' is shown in FIG. 3. The semiconductor device 100' may exhibit increased capacitance due to the increased surface area of the compensation capacitor 120'. The semiconductor device 100' includes the first and second wiring structures 105A, 105B (e.g., first and second interconnections 135A, 135B), the insulating material 110, the interlayer insulating material 115, the compensation capacitor 120 (lower electrode 150, patterned dielectric material 155', upper electrode 160), the iRDL 130 (third and fourth interconnections 135C, 135D), the first and second interconnections 105A/135A, 105B/135B, the first and second contacts 140A, 140B, the opening 125, and the wiring structures 105B, 105C as described above in relation to FIGS. 1 and 2.

Figure 4:
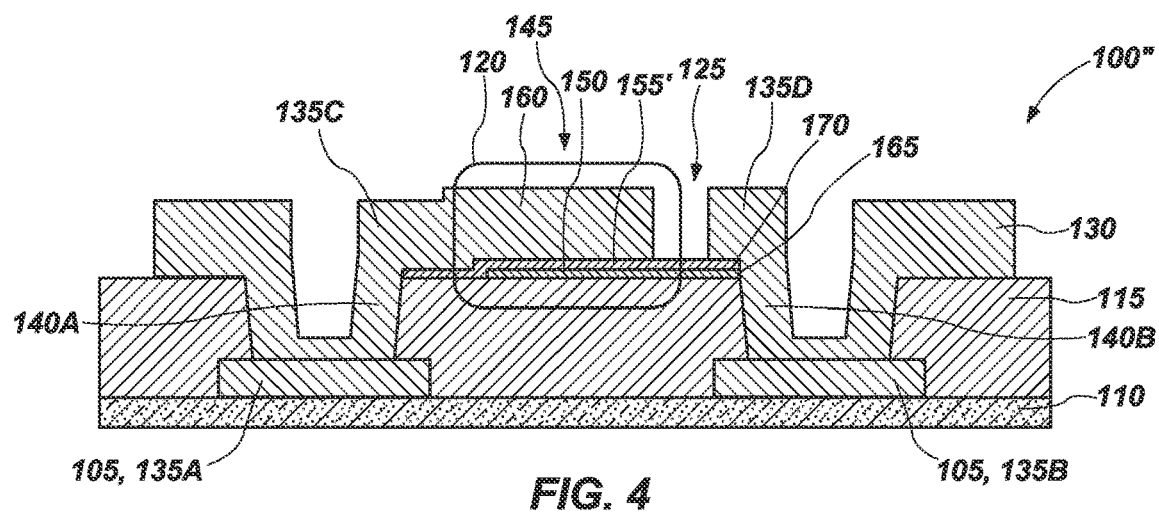

A semiconductor device 100" in which the patterned dielectric material 155' is located only in the capacitor region 145 and adjacent to the capacitor region 145 is shown in FIG. 4. The semiconductor device 100" is similar to the semiconductor device 100 except that the patterned dielectric material 155' is not present over portions of the interlayer insulating material 115 outside of the capacitor region 145. The semiconductor device 100" includes the first and second wiring structures (interconnections) 105A/135A and 105B/135B, the insulating material 110, the interlayer insulating material 115, the compensation capacitor 120 (lower electrode 150, patterned dielectric material 155', upper electrode 160), the iRDL 130 (third and fourth interconnections 135C, 135D), the first and second interconnections 135A, 135B, the first and second contacts 140A, 140B, the opening 125, and the wiring structures 105B, 105C as described above in relation to FIGS. 1 and 2.

Figure 5:
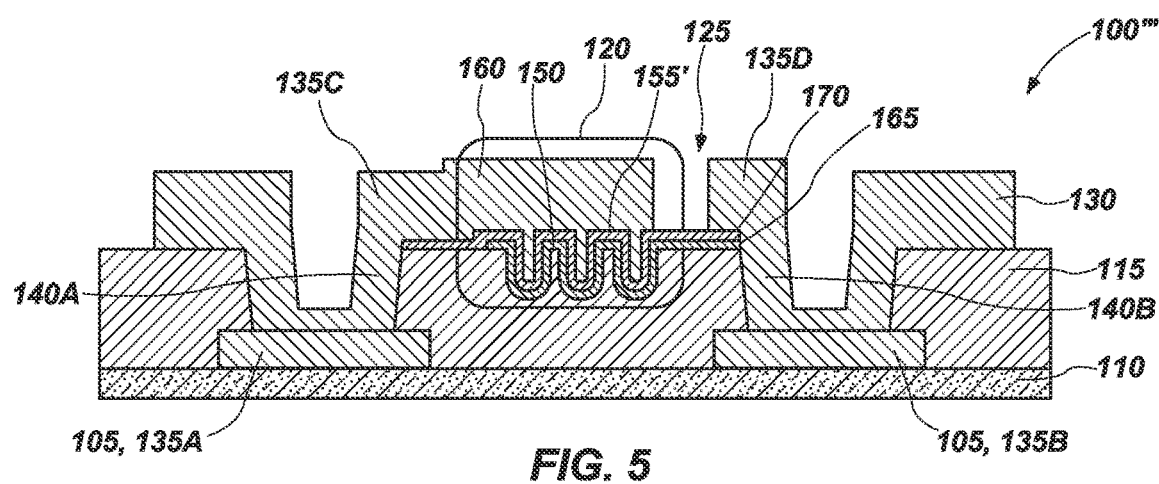

As shown in FIG. 5, a semiconductor device 100''' may also include the lower electrode 150, patterned dielectric material 155', and upper electrode 160 contained in capacitor trenches in the interlayer insulating material 115, similar to FIG. 3, except that the patterned dielectric material 155' is present only in the capacitor region 145 and adjacent to the capacitor region 145. The semiconductor device 100''' includes the wiring structure 105A, the insulating material 110, the interlayer insulating material 115, the compensation capacitor 120 (lower electrode 150, patterned dielectric material 155', upper electrode 160), the iRDL 130 (third and fourth interconnections 135C, 135D), the first and second interconnections 135A, 135B (e.g., wiring structures 105A, 105), the first and second contacts 140A, 140B, and the opening 125 as described above in relation to FIGS. 1 and 2.

Figure 6:
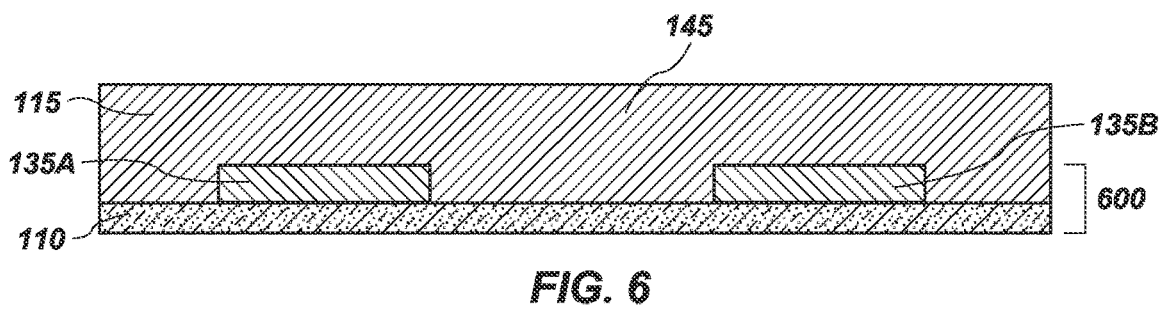
FIGS. 6-12 are cross-sectional views showing various stages of forming the semiconductor device of FIG. 1 in accordance with embodiments of the disclosure.

To form the semiconductor device 100, the interlayer insulating material 115 is formed over a structure 600 containing the wiring structures (interconnections) 135A and 135B on an insulating material 110 as shown in FIG. 6. The structure 600 including the wiring structures 105A, 105B (e.g., first and second interconnections 135A, 135B) on the insulating material 110 may be formed by conventional techniques. The wiring structures 105A, 105B may, for example, be a contact (e.g., a landing pad). The interlayer insulating material 115 may be formed over the structure 600 by conventional techniques. The interlayer insulating material 115 may be formed over the structure 600 at a thickness sufficient to electrically isolate the wiring structures 105A and 105B from the iRDL thereover. In some embodiments, the interlayer insulating material 115 may be formed at a thickness of from about 1 μm to about 10 μm, such as from about 1 μm to about 9 μm, from about 1 μm to about 8 μm, from about 1 μm to about 7 μm, from about 1 μm to about 6 μm, from about 4 μm to about 10 μm, from about 5 μm to about 10 μm, or from about 5 μm to about 10 μm. In some embodiments, the interlayer insulating material 115 may be formed at a thickness of about 6 μm. After forming the interlayer insulating material 115, a top surface of the interlayer insulating material 115 may be subjected to an abrasive planarization act, such as a chemical-mechanical planarization (CMP) act.

Figure 7:
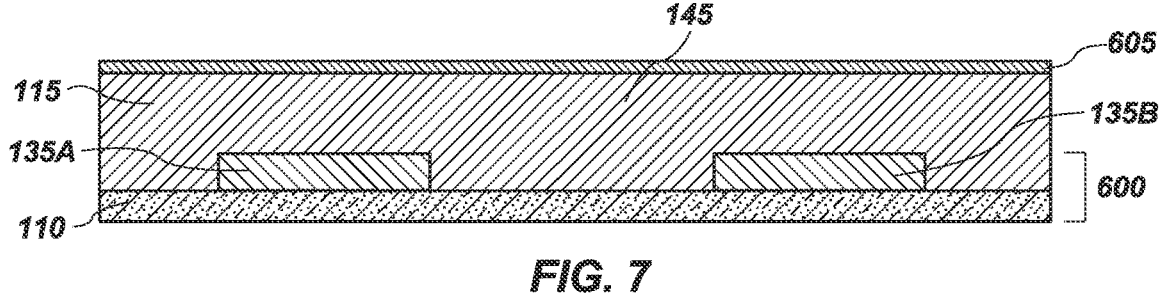
Figure 8:
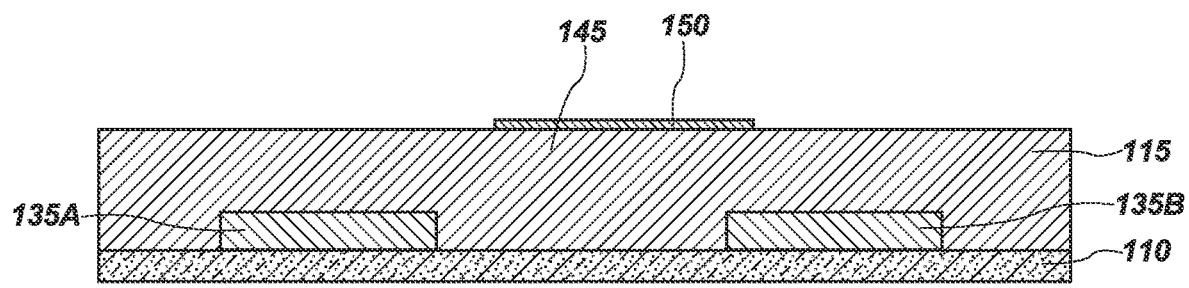

A lower electrode material 605 is formed over the interlayer insulating material 115, as shown in FIG. 7. The lower electrode material 605 may be one of the above-mentioned electrically conductive materials and is formed over and contacts substantially all of the top surface of the interlayer insulating material 115. The lower electrode material 605 may be formed at a thickness sufficient for the material to function as a lower electrode 150. The lower electrode material 605 may be formed on the interlayer insulating material 115 by conventional techniques. The lower electrode material 605 may be patterned to form the lower electrode 150 on the interlayer insulating material 115 in the capacitor region 145, as shown in FIG. 8. One end of the lower electrode 150 may overlap with (e.g., extend over) the location of the second interconnection 135B and the other end of the lower electrode 150 may extend toward, but be spaced apart from, the location of the first interconnection 135A. The lower electrode material 605 may be patterned by conventional photolithography techniques to form the lower electrode 150. For instance, a photoresist material (not shown) may be formed over the lower electrode material 605 and patterned by conventional techniques, with the pattern in the photoresist material subsequently transferred to the lower electrode material 605. A dry etch process may, for example, be used to form the lower electrode 150.

Figure 9:
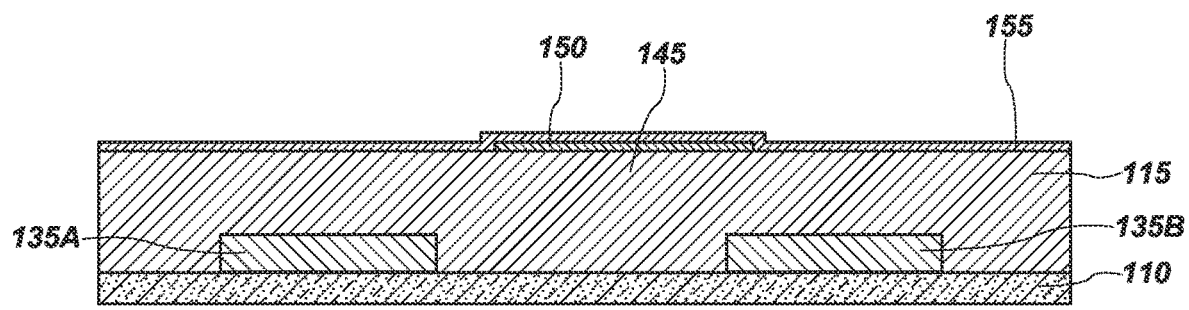

The dielectric material 155 may be formed by conventional techniques over the top surface of the interlayer insulating material 115 and over a top surface and sidewalls of the lower electrode 150 as shown in FIG. 9. The dielectric material 155 may be conformally formed over the interlayer insulating material 115 and the lower electrode 150. The thickness of the dielectric material 155 may be less than or equal to about 10 nm, such as from about 1 nm to less than or equal to about 10 nm, from about 1 nm to less than or equal to about 5 nm, from about 5 nm to less than or equal to about 10 nm, from about 2 nm to less than or equal to about 10 nm, from about 3 nm to less than or equal to about 10 nm, from about 4 nm to less than or equal to about 10 nm, from about 5 nm to less than or equal to about 10 nm, from about 6 nm to less than or equal to about 10 nm, from about 7 nm to less than or equal to about 10 nm, from about 8 nm to less than or equal to about 10 nm, or from about 9 nm to less than or equal to about 10 nm. In some embodiments, the dielectric material 155 may be a high-k dielectric material and be less than or equal to about 10 nm in thickness.

Figure 10:
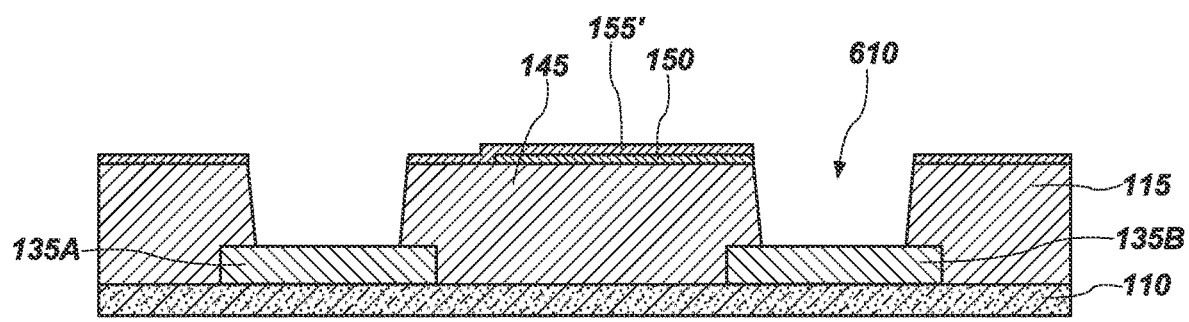

Portions of the dielectric material 155 and the interlayer insulating material 115 overlying the wiring structures 105 (e.g., first and second interconnections 135A, 135B) are removed to expose a top surface of the first and second interconnections 135A, 135B and sidewalls of the interlayer insulating material 115, as shown in FIG. 10. The dielectric material 155 and the interlayer insulating material 115 are removed by conventional photolithography techniques to form trenches 610 defined by the sidewalls of the interlayer insulating material 115. A photoresist material (not shown) is formed over the dielectric material 155 and patterned by conventional techniques, with the pattern in the photoresist material subsequently transferred to the dielectric material 155 and the interlayer insulating material 115. A dry etch process may, for example, be used to form the patterned dielectric material 155' and the trenches 610.

Figure 11:
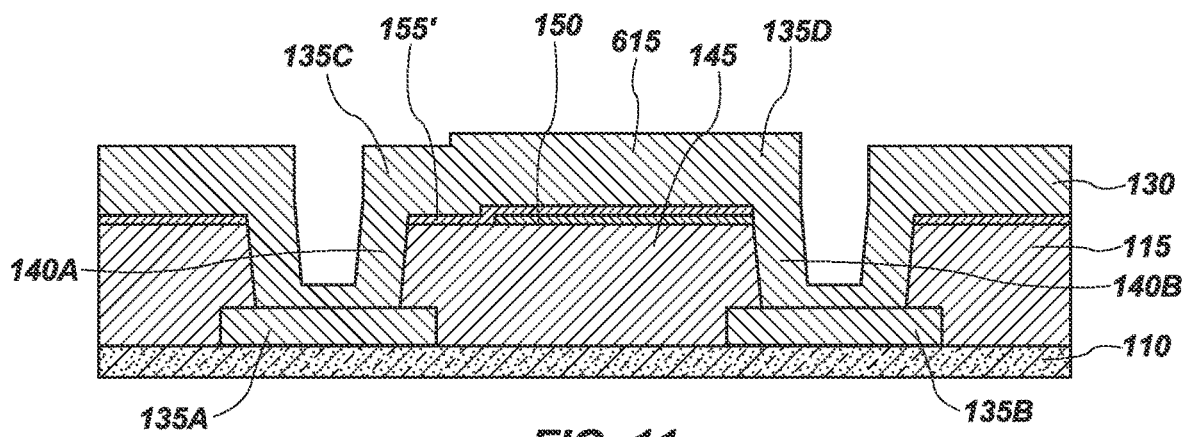

Electrically conductive material 615 for the iRDL 130 is formed in the trenches 610 and over the patterned dielectric material 155', as shown in FIG. 11. The electrically conductive material 615 may be conformally formed over the top surface of the patterned dielectric material 155', over the exposed sidewalls of the interlayer insulating material 115, and over the top surface of the wiring structure 105. The electrically conductive material 615 overlying the patterned dielectric material 155' and the lower electrode 150 may form an electrode (e.g., the upper electrode 160) of the compensation capacitor 120, as shown in FIG. 1. While FIG. 1 illustrates the electrically conductive material 615 as being a single material, the electrically conductive material 615 may include multiple materials, such as Ti—Al—TiN, where the titanium is formed on the top surface of the patterned dielectric material 155', over the exposed sidewalls of the interlayer insulating material 115, and over the top surface of the wiring structures 105. The aluminum may be formed over the titanium, and the titanium nitride may be formed over the aluminum, forming the iRDL 130.

Figure 12:
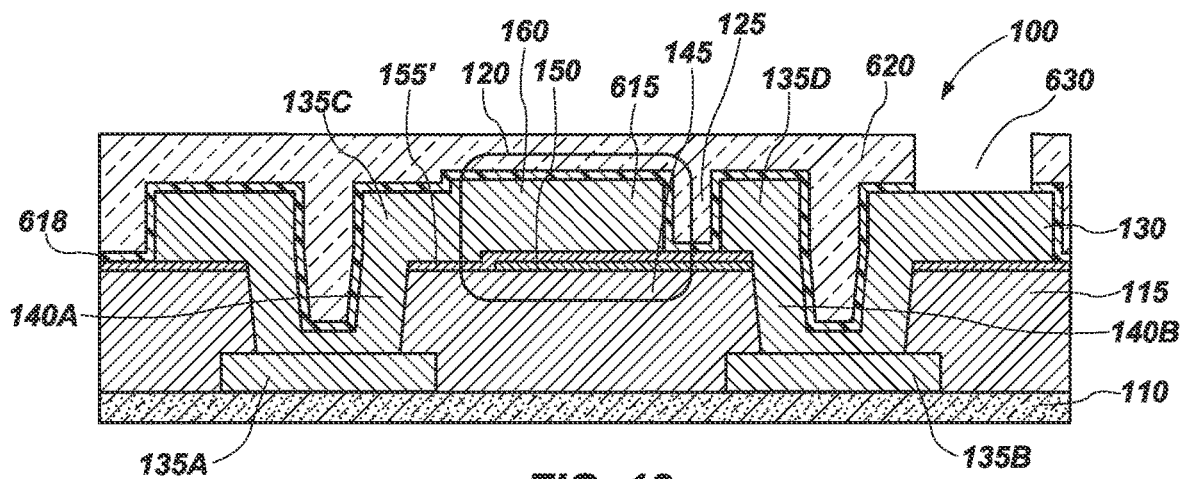

The iRDL 130 is then patterned so that a portion of the electrically conductive material 615 adjacent to the capacitor region 145 may be removed, forming the opening 125 and exposing an underlying portion of the patterned dielectric material 155', as shown in FIGS. 1 and 12. The opening 125 may be formed by conventional photolithography techniques, such as by a dry etch process. The opening 125 defines one boundary of the upper electrode 160 of the compensation capacitor 120. Sidewalls of the electrically conductive material 615 in the capacitor region 145 may define the upper electrode 160, as shown in FIG. 1. The lower electrode 150, the patterned dielectric material 155', and the upper electrode 160 form the compensation capacitor 120, which connects the iRDL 130 to the wiring structures 105A, 105B through the first and second contacts 140A, 140B and the third and fourth interconnections 135C, 135D. The compensation capacitor 120 is thus formed in the capacitor region 145 over the interlayer insulating material 115. Remaining portions of the electrically conductive material 615 located over the patterned dielectric material 155' form the third and fourth interconnections 135C, 135D (i.e., the iRDL 130) and remaining portions of the electrically conductive material 615 located on the sidewalls of the interlayer insulating material 115 form the first and second contacts 140A, 140B. After patterning the iRDL 130 including the opening 125, a passivation material 618, such as a silicon nitride (SiN) or a silicon oxynitride (SiON), and an insulative material 620, such as a polyimide, may be formed over the entire surface of the device, as shown in FIG. 12. A portion of the passivation material 618 and the insulative material 620 are selectively removed to expose respective portions of the electrically conductive material 615 (e.g., the iRDL 130), such portions each serving as a bonding pad 630. In use and operation, a ground (GND) voltage may be applied to the bonding pad 630 and conveyed to the lower electrode 150 of the compensation capacitor 120 and the second interconnection 135B through the fourth interconnection 135D and the second contact 140B of the iRDL 130. Additionally, a power (VDD) voltage may be applied to another bonding pad (not shown in FIG. 12) that is coupled to the third interconnections 135C of the iRDL 130 and conveyed to the upper electrode 160 of the compensation capacitor 120 and the first interconnection 135A and the first contact 140A. The subsequent process acts may be conducted by conventional techniques, which are not described in detail herein.

Figure 13:
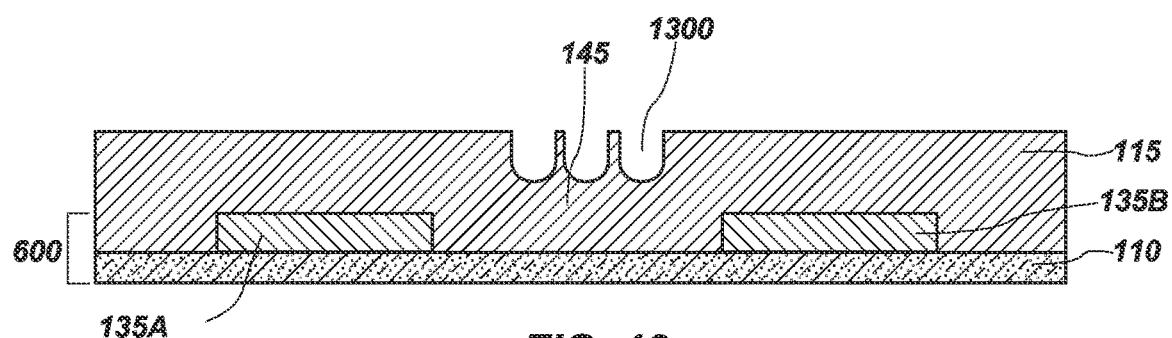
FIGS. 13-18 are cross-sectional views showing various stages of forming the semiconductor device of FIG. 3 in accordance with embodiments of the disclosure.
Figure 14:
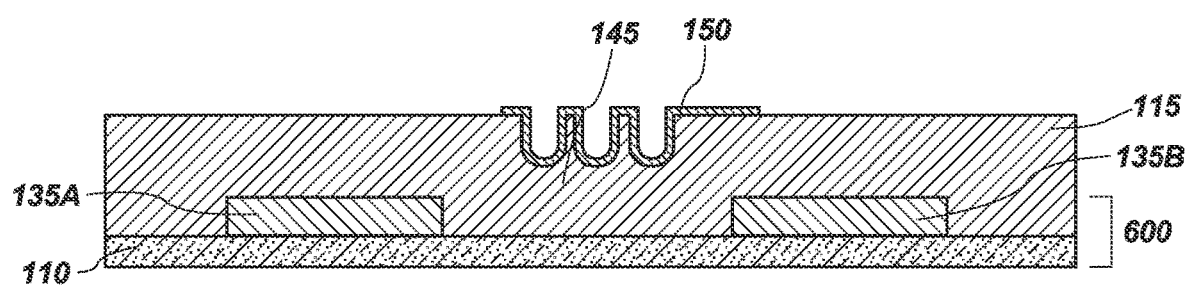
Figure 15:
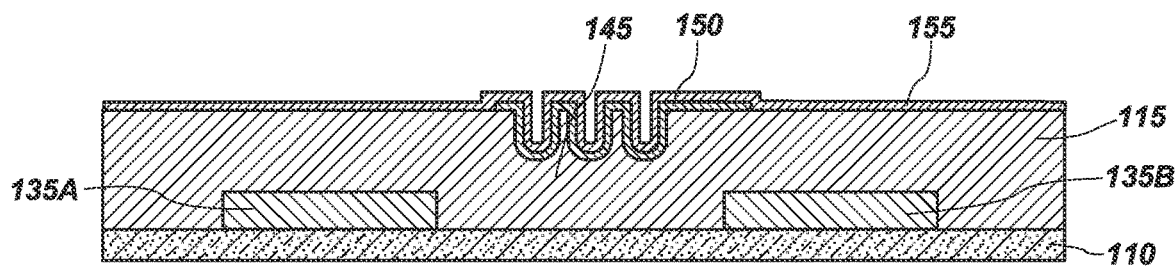

To form the semiconductor device 100' with the higher surface area compensation capacitor 120', capacitor trenches 1300 are formed in the capacitor region 145 of the interlayer insulating material 115, as shown in FIG. 13. The capacitor trenches 1300 are formed in the capacitor region 145 over the structure 600 including the wiring structure 105A and the insulating material 110, which is substantially as described above in relation to FIG. 6. The capacitor trenches 1300 are defined by sidewalls of the interlayer insulating material 115 and are formed in the capacitor region 145 between adjacent wiring structures 105 by conventional photolithography techniques. For instance, a photoresist material (not shown) may be formed over the interlayer insulating material 115 and patterned by conventional techniques, with the pattern in the photoresist material subsequently transferred to the interlayer insulating material 115. A dry etch process may, for example, be used to form the capacitor trenches 1300. The lower electrode material 605 may be formed on the sidewalls of the capacitor trenches 1300 and over the top surface of the interlayer insulating material 115 and patterned by conventional photolithography techniques to form the lower electrode 150 in the capacitor trenches 1300, as shown in FIG. 14. The dielectric material 155 is formed over the lower electrode 150 in the capacitor trenches 1300 and over the top surface of the interlayer insulating material 115, as shown in FIG. 15.

Figure 16:
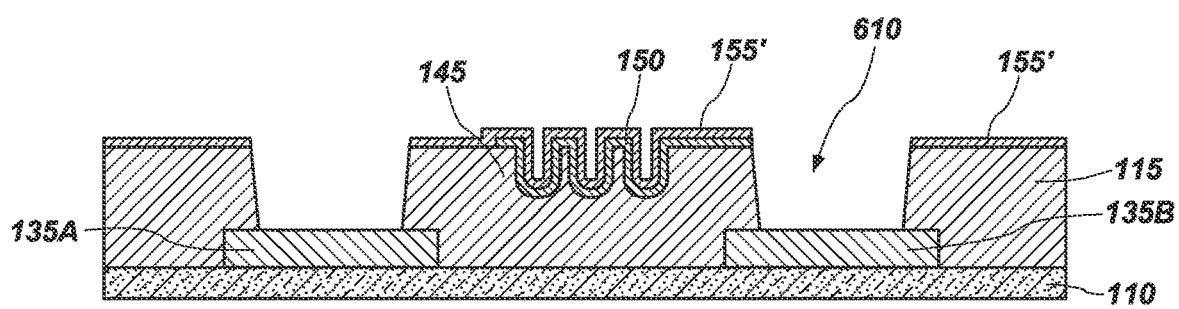

As shown in FIG. 16, portions of the dielectric material 155 and the interlayer insulating material 115 overlying the wiring structure 105 may be removed to expose the top surface of the wiring structure 105 and the sidewalls of the interlayer insulating material 115. Removal of the dielectric material 155 and the interlayer insulating material 115 is conducted substantially as described above in relation to FIG. 10. The dielectric material 155 and the interlayer insulating material 115 are removed by conventional photolithography techniques to form the patterned dielectric material 155' and the trenches 610 in the interlayer insulating material 115. The trenches 610 are formed by conventional photolithography techniques, such as by a dry etch process.

Figure 17:
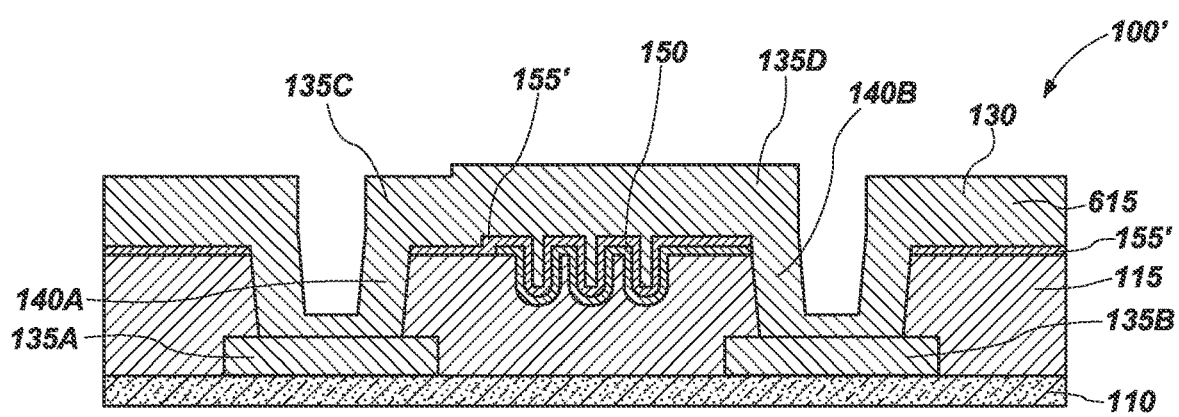

The electrically conductive material 615 is formed in the trenches 610 and over the patterned dielectric material 155', as shown in FIG. 17. The electrically conductive material 615 may be conformally formed over the top surface of the patterned dielectric material 155', over the sidewalls of the interlayer insulating material 115, and over the top surface of the wiring structure 105. While FIG. 17 illustrates the electrically conductive material 615 as being a single material, the electrically conductive material 615 may include multiple materials, such as Ti—Al—TiN.

The iRDL 130 is then patterned so that a portion of the iRDL 130 may be removed, forming the opening 125 and exposing an underlying portion of the patterned dielectric material 155', as shown in FIG. 3. The opening 125 may be formed by conventional photolithography techniques, such as by a dry etch process. The opening 125 defines one boundary of the upper electrode 160 of the compensation capacitor 120. The lower electrode 150, the patterned dielectric material 155', and the upper electrode 160 form the compensation capacitor 120, which connects the iRDL 130 to the wiring structures 105A/135A, 105B/135B through the first and second contacts 140A, 140B and the third and fourth interconnections 135C, 135D. The compensation capacitor 120 is thus formed in the capacitor region 145 over the interlayer insulating material 115. Remaining portions of the iRDL 130 located over the patterned dielectric material 155' form the third and fourth interconnections 135C, 135D and remaining portions of the iRDL 130 located on the sidewalls of the interlayer insulating material 115 form the first and second contacts 140A, 140B.

Figure 18:
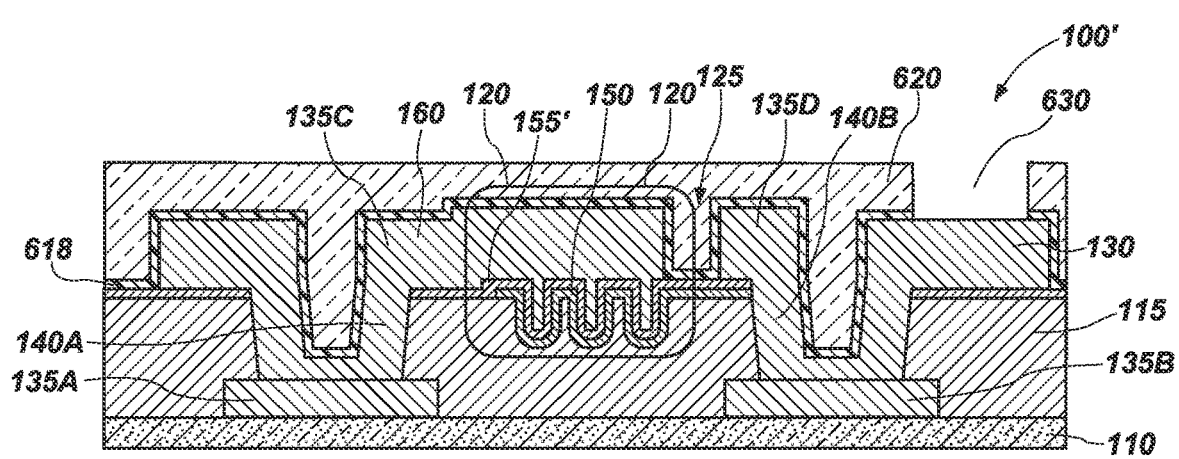

After patterning the iRDL 130 including the opening 125, the passivation material 618, such as SiN or SiON, and the insulative material 620, such as the polyimide, may be formed over the entire surface of the device, as shown in FIG. 18. A portion of the passivation material 618 and the insulative material 620 are selectively removed to expose respective portions of the electrically conductive material 615 (e.g., the iRDL 130), such portions each serving as a bonding pad 630. In use and operation, a GND voltage may be applied to the bonding pad 630 and conveyed to the lower electrode 150 of the compensation capacitor 120 and the second interconnection 135B through the fourth interconnection 135D and the second contact 140B of the iRDL 130. Additionally, a VDD voltage may be applied to another bonding pad (not shown in FIG. 18) that is coupled to the third interconnections 135C of the iRDL 130 and conveyed to the upper electrode 160 of the compensation capacitor 120 and the first interconnection 135A and the first contact 140A. The subsequent process acts may be conducted by conventional techniques, which are not described in detail herein.

Figure 19:
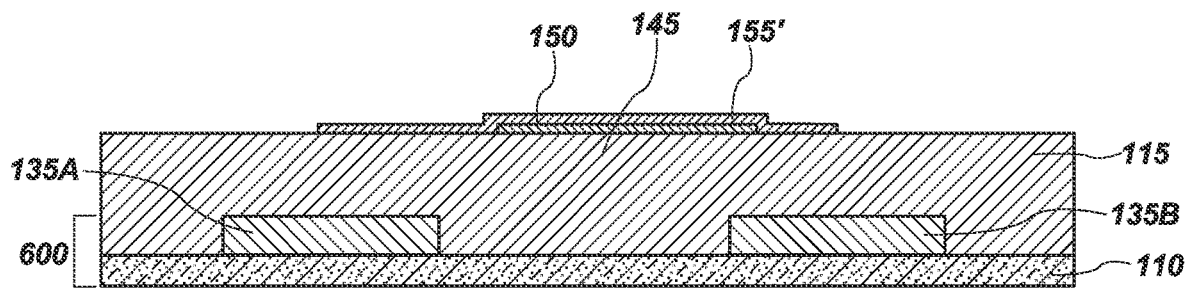
FIGS. 19-22 are cross-sectional views showing various stages of forming the semiconductor device of FIG. 4 in accordance with embodiments of the disclosure.
Figure 20:
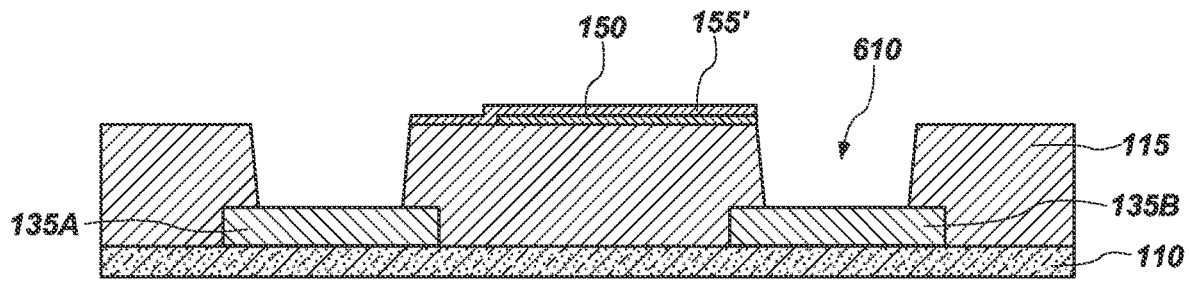

To form the semiconductor device 100", a lower electrode material and the dielectric material 155 are formed over the interlayer insulating material 115 over the structure 600 and patterned as shown in FIG. 19. The lower electrode material may be formed over the interlayer insulating material 115 and patterned to form the lower electrode 150 in the capacitor region 145 as described above in relation to FIGS. 6 and 7. The dielectric material may be formed over the lower electrode 150 in the capacitor region 145 and patterned by conventional techniques, as described above in relation to FIGS. 9, 10, and 11, to form the patterned dielectric material 155'. The patterned dielectric material 155' may extend between the wiring structures 105 and the lower electrode 150 may be positioned below the patterned dielectric material 155'. Portions of the patterned dielectric material 155' and the interlayer insulating material 115 overlying the wiring structures 105 are removed to expose the top surface of the wiring structures 135A, 135B and sidewalls of the interlayer insulating material 115, as shown in FIG. 20, and to form the trenches 610. In FIG. 20, the patterned dielectric material 155' is present only in the capacitor region 145 and adjacent to the capacitor region 145. The semiconductor device 100" is similar to the semiconductor device 100 except that the patterned dielectric material 155' is not present over portions of the interlayer insulating material 115 outside of the capacitor region 145. The semiconductor device 100" includes the wiring structures 105A, 105B (first and second interconnections 135A, 135B), the insulating material 110, the interlayer insulating material 115, the compensation capacitor 120 (lower electrode 150, patterned dielectric material 155', upper electrode 160), the iRDL 130

(third and fourth interconnections 135C, 135D), the first and second contacts 140A, 140B, and the opening 125, as described above in relation to FIGS. 1 and 2.

Figure 21:
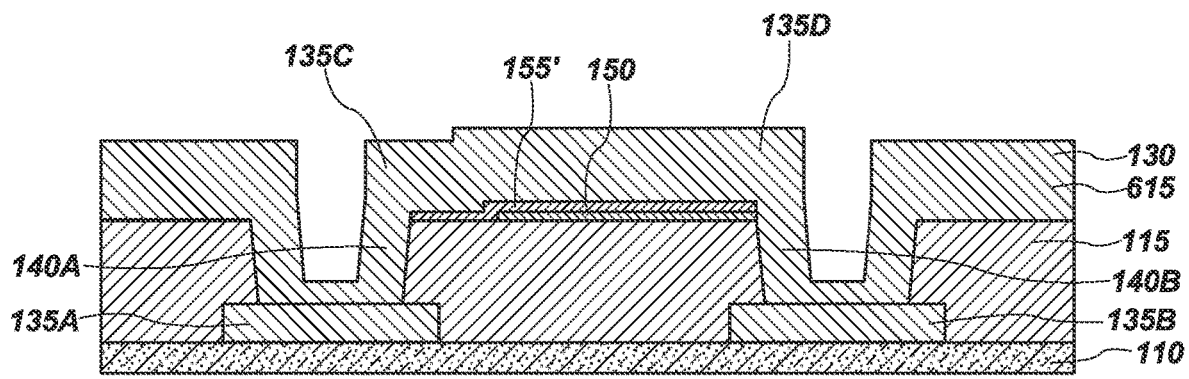

The electrically conductive material 615 for the iRDL 130 is formed in the trenches 610, over the interlayer insulating material 115, and over the patterned dielectric material 155', as shown in FIG. 21. The electrically conductive material 615 may be conformally formed over the top surface of the patterned dielectric material 155', over the top surface and sidewalls of the interlayer insulating material 115, and over the top surface of the wiring structures 105. While FIG. 21 illustrates the electrically conductive material 615 as being a single material, the electrically conductive material 615 may include multiple materials, such as Ti—Al—TiN.

The iRDL 130 is then patterned so that a portion of the electrically conductive material 615 of the iRDL 130 adjacent to the capacitor region 145 may be removed, forming the opening 125 and exposing an underlying portion of the patterned dielectric material 155', as shown in FIG. 4. The opening 125 may be formed by conventional photolithography techniques, such as by a dry etch process. The opening 125 defines one boundary of the upper electrode 160 of the compensation capacitor 120. Sidewalls of the electrically conductive material 615 in the capacitor region 145 may define the upper electrode 160, as shown in FIG. 4. The lower electrode 150, the patterned dielectric material 155', and the upper electrode 160 form the compensation capacitor 120, which connects the iRDL 130 to the wiring structures 105A, 105B through the first and second contacts 140A, 140B and the third and fourth interconnections 135C, 135D. The compensation capacitor 120 is thus formed in the capacitor region 145 over the interlayer insulating material 115. Remaining portions of the electrically conductive material 615 located over the patterned dielectric material 155' form the third and fourth interconnections 135C, 135D (i.e., the iRDL 130) and remaining portions of the electrically conductive material 615 located on the sidewalls of the interlayer insulating material 115 form the first and second contacts 140A, 140B.

Figure 22:
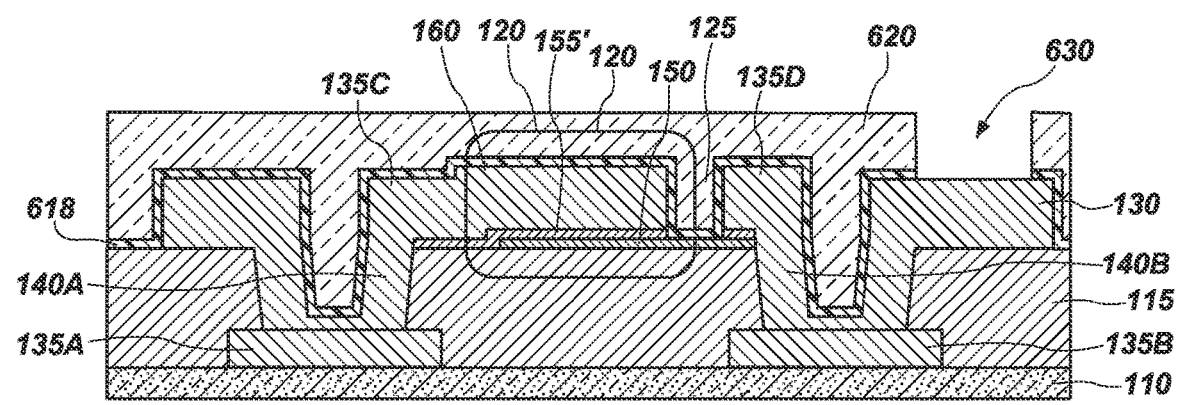

After patterning the iRDL 130 including the opening 125, the passivation material 618, such as SiN or SiON, and the insulative material 620, such as the polyimide, may be formed over the entire surface of the device, as shown in FIG. 22. A portion of the passivation material 618 and the insulative material 620 are selectively removed to expose respective portions of the electrically conductive material 615 (e.g., the iRDL 130), such portions each serving as a bonding pad 630. In use and operation, a GND voltage may be applied to the bonding pad 630 and conveyed to the lower electrode 150 of the compensation capacitor 120 and the second interconnection 135B through the fourth interconnection 135D and the second contact 140B of the iRDL 130. Additionally, a VDD voltage may be applied to another bonding pad (not shown in FIG. 22) that is coupled to the third interconnections 135C of the iRDL 130 and conveyed to the upper electrode 160 of the compensation capacitor 120 and the first interconnection 135A and the first contact 140A. The subsequent process acts may be conducted by conventional techniques, which are not described in detail herein.

To form the semiconductor device 100''' (see FIG. 5), the capacitor trenches 1300 are formed in the interlayer insulating material 115, as described in relation to FIG. 13, and the lower electrode 150 and patterned dielectric material 155' are formed in the capacitor trenches 1300 as described in relation to FIGS. 14 and 15. Trenches 610 are formed in the interlayer insulating material 115, as described in relation to FIG. 16, except that the dielectric material 155 outside the capacitor region 145 is removed to form the patterned dielectric material 155'. The patterned dielectric material 155' is, therefore, only present in the capacitor region 145 and adjacent to the capacitor region 145 as described in relation to FIGS. 19 and 20. The opening 125 in the interlayer insulating material 115 may be formed by conventional photolithography techniques, such as by a dry etch process. The passivation material 618 and the insulative material 620 and bonding pads may be then formed as described in relation to FIG. 18. Additional processing acts may subsequently be conducted to form a complete semiconductor device that includes the semiconductor device 100'''. The subsequent process acts may be conducted by conventional techniques, which are not described in detail herein.

When forming the compensation capacitor 120 in the capacitor region 145, the lower electrode material 605 and the dielectric material 155 of the semiconductor devices 100, 100', 100'' are formed over the interlayer insulating material 115 and patterned to form the lower electrode 150 and the patterned dielectric material 155' at desired dimensions. Since the lower electrode material 605 and the dielectric material 155 of the compensation capacitor 120 are patterned to the desired dimensions, rather than being formed in small openings at the desired dimensions, the methods according to embodiments of the disclosure produce the semiconductor devices 100, 100', 100'' by a less complex and more reliable process compared to conventional techniques. The methods according to embodiments of the disclosure, thus, enable the compensation capacitors 120 to be formed at small dimensions in memory devices (e.g., DRAM devices). Therefore, the compensation capacitors 120 of the semiconductor devices 100, 100', 100'', 100''' are formed by a simple and reliable process and without increasing the footprint of the compensation capacitors 120.

Figure 23:
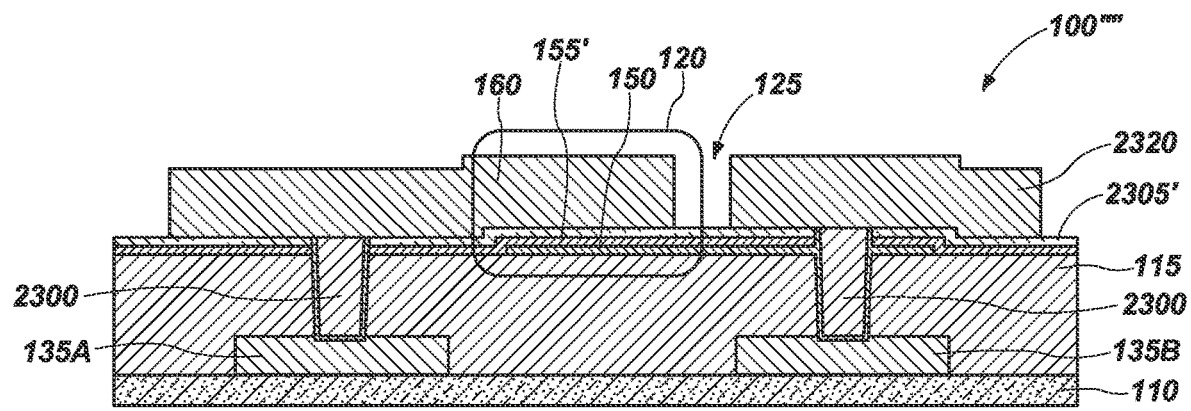
FIG. 23 is a cross-sectional view showing a semiconductor device according to another embodiment of the disclosure.

A semiconductor device 100'''' is shown in FIG. 23 and includes contact plugs 2300 provided independently of an iRDL. The semiconductor device 100'''' includes wiring structures 105 (135A, 135B), interlayer insulating material 115, compensation capacitor 120, contact plugs 2300, and second electrically conductive material 2320 on a base material (not shown). The second electrically conductive material 2320 is formed as the iRDL. The contact plugs 2300 electrically connect the compensation capacitor 120 to the wiring structures 105. The compensation capacitor 120 is located above the wiring structures 105 and the contact plugs 2300 in the capacitor region 145 on the interlayer insulating material 115. The compensation capacitor 120 may include a lower electrode 150, a patterned dielectric material 155' over the lower electrode 150, a patterned CMP etch stop material 2305' over the patterned dielectric material 155', and an upper electrode 160 over the patterned CMP etch stop material 2305'. A portion of the second electrically conductive material 2320 in the capacitor region 145 functions as the upper electrode 160 of the compensation capacitor 120. Another portion of the second electrically conductive material 2320 is coupled to the lower electrode 150 through the contact plug 2300. Multiple levels of the wiring structures 105 may be present in the semiconductor device 100'''', with the second electrically conductive material 2320 being the uppermost wiring structure 105. While FIG. 23 shows two levels of wiring structures 105A, 105B, additional wiring structures 105C, 105D may be below the wiring structures 105A, 105B, as shown in FIG. 2. Each level of wiring structures 105 includes a metal material that is isolated from metal materials of other levels of wiring structure 105 by the interlayer insulating material 115. Each level of wiring structure 105 is electrically coupled to another level of wiring structure 105 by the contact plugs 2300.

Figure 24:
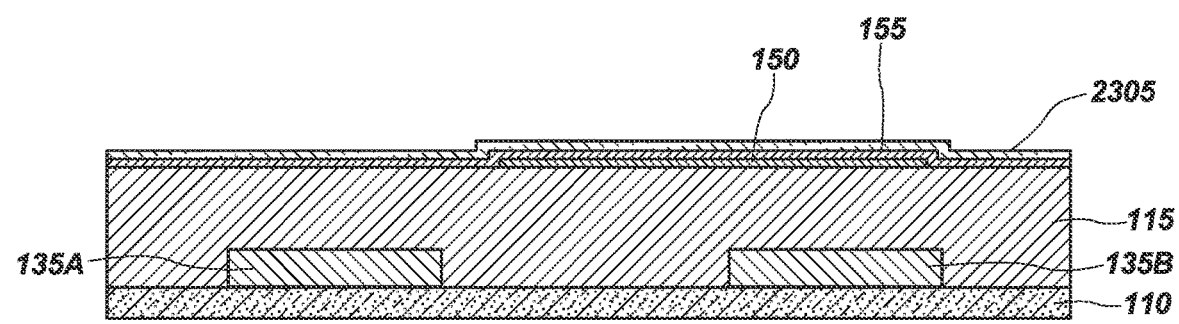
FIGS. 24-28 are cross-sectional views showing various stages of forming the semiconductor device of FIG. 23 in accordance with embodiments of the disclosure.

To form the semiconductor device 100'''', the lower electrode material 605 is formed over the interlayer insulating material 115 on the structure 600 and patterned as described in relation to FIGS. 6 and 7. The structure 600 includes the wiring structures 105A, 105B in the insulating material 110, as described in relation to FIGS. 1 and 2. The lower electrode material 605 may be patterned to form the lower electrode 150 in the capacitor region 145 as described in relation to FIGS. 6 and 7. The dielectric material 155 may be formed by conventional techniques over the top surface of the interlayer insulating material 115 and over the top surface and sidewalls of the lower electrode 150, as described in relation to FIG. 9. A CMP etch stop material 2305 is formed over the dielectric material 155, as shown in FIG. 24. The CMP etch stop material 2305 may be formed by conventional techniques. The CMP etch stop material 2305 may be silicon oxide, silicon nitride, or other material selectively etchable relative to the electrically conductive material 615.

Figure 25:
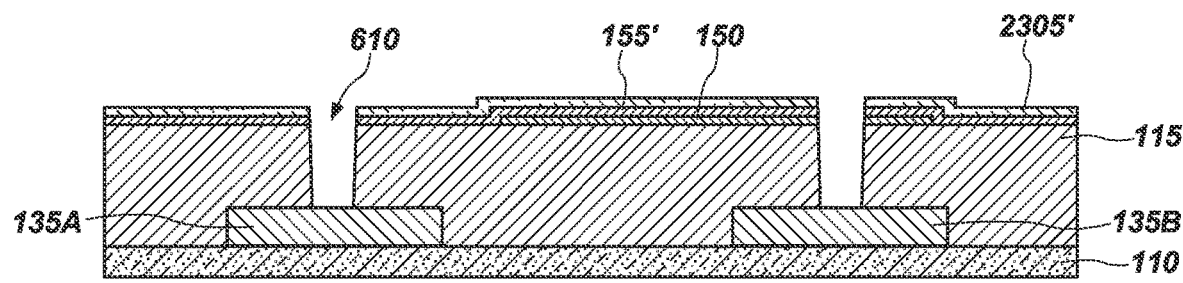

Portions of the CMP etch stop material 2305, the dielectric material 155, and the interlayer insulating material 115 overlying the wiring structures 105 are removed to expose a top surface of the wiring structures 105 (135A, 135B) and sidewalls of the interlayer insulating material 115, as shown in FIG. 25. The CMP etch stop material 2305, the dielectric material 155, and the interlayer insulating material 115 are removed by conventional photolithography techniques to form the patterned dielectric material 155', the patterned CMP etch stop material 2305', and the trenches 610 in the interlayer insulating material 115. The trenches 610 may, for example, be formed by conventional photolithography techniques, such as by a dry etch process, as described in relation to FIG. 10.

Figure 26:
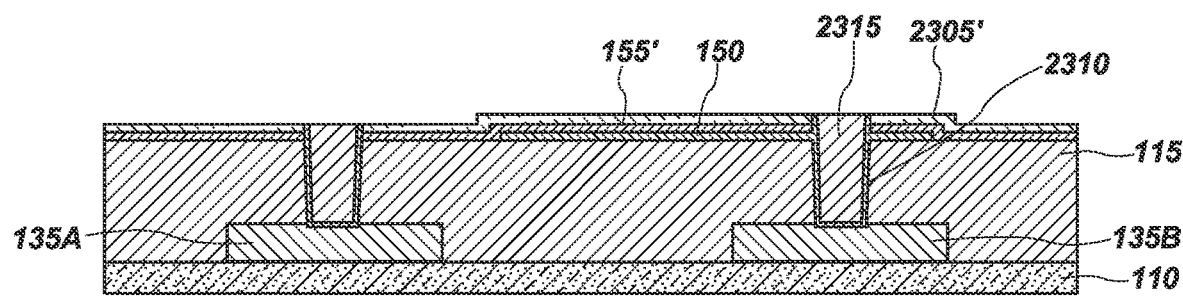

A liner 2310 is formed in the trenches 610 and a first electrically conductive material 2315 is formed over the liner 2310 as shown in FIG. 26. The liner 2310 and first electrically conductive material 2315 may be formed by conventional techniques. Excess first electrically conductive material 2315 formed over the CMP etch stop material 2305 may be removed, such as by an abrasive planarization act. In some embodiments, the liner 2310 is formed from TiN and the first electrically conductive material 2315 is tungsten.

Figure 27:
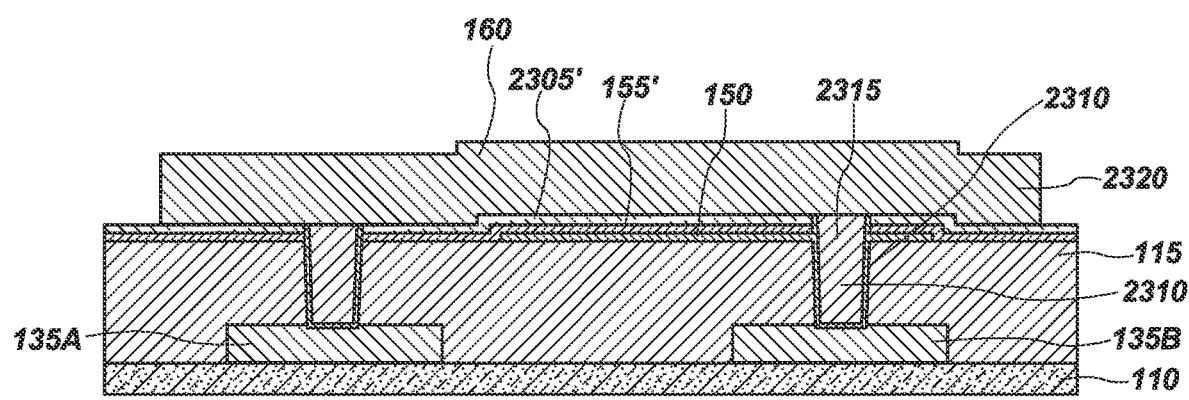

The second electrically conductive material 2320 for the iRDL is conformally formed over the top surface of the patterned CMP etch stop material 2305', as shown in FIG. 27. The second electrically conductive material 2320 overlying the dielectric material 155' and the lower electrode 150 may form an electrode (e.g., the upper electrode 160) of the compensation capacitor 120. While FIG. 27 illustrates the upper electrode 160 as being a single material, the upper electrode 160 may include multiple materials, such as Ti—Al—TiN.

The second electrically conductive material 2320 is then patterned in that a portion of the second electrically conductive material 2320 adjacent to the capacitor region 145 may be removed, forming the opening 125 and exposing an underlying portion of the patterned dielectric material 155', as shown in FIG. 23. The opening 125 may be formed by conventional photolithography techniques, such as by a dry etch process. The opening 125 defines one boundary of the upper electrode 160 of the compensation capacitor 120. Sidewalls of the second electrically conductive material 2320 in the capacitor region 145 may define the upper electrode 160, as shown in FIG. 23. The lower electrode 150, the patterned dielectric material 155', and the upper electrode 160 form the compensation capacitor 120, which connects to the wiring structures 105 (135A, 135B) through the contact plugs 2300. The compensation capacitor 120 is, thus, formed in the capacitor region 145 of the interlayer insulating material 115.

Figure 28:
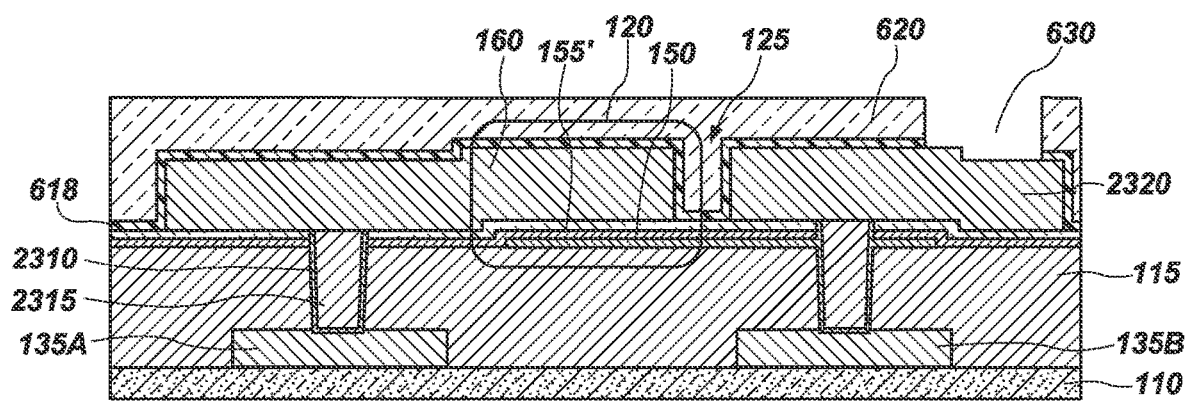

The passivation material 618, such as the SiN or SiON, and the insulative material 620, such as the polyimide, may be formed over the entire surface of the device, as shown in FIG. 28. A portion of the passivation material 618 and the insulative material 620 are selectively removed to expose respective portions of the electrically second electrically conductive material 2320 (e.g., the iRDL 130), such portions each serving as a bonding pad 630. In use and operation, a ground (GND) voltage may be applied to the bonding pad 630 and conveyed to the lower electrode 150 of the compensation capacitor 120 and the second interconnection 135B through the first electrically conductive material 2315 and the second electrically conductive material 2320. Additionally, a power (VDD) voltage may be applied to another bonding pad (not shown in FIG. 28) that is coupled to the first electrically conductive material 2315 and conveyed to the upper electrode 160 of the compensation capacitor 120. Additional processing acts may subsequently be conducted to form a complete semiconductor device that includes the semiconductor device 100''''. The subsequent process acts may be conducted by conventional techniques, which are not described in detail herein.

Accordingly, an apparatus is disclosed. The apparatus comprises a first interconnection and a second interconnection spaced apart from one another, an interlayer insulating material over the first and second interconnections, a first contact and a second contact in the interlayer insulating material and spaced apart from one another, a third interconnection and a fourth interconnection over the interlayer insulating material and spaced apart from one another, and a compensation capacitor in a capacitor region. The third interconnection is coupled with the first interconnection through the first contact and the fourth interconnection is coupled with the second interconnection through the second contact. The compensation capacitor comprises a lower electrode over the interlayer insulating material, a dielectric material over the lower electrode, and an upper electrode over the dielectric material. The lower electrode comprises an edge portion in contact with the second contact. The third interconnection is elongated over the dielectric material of the compensation capacitor to provide an elongated portion as the upper electrode of the compensation capacitor.

Accordingly, another apparatus is disclosed. The apparatus comprises first interconnections and second interconnections on a base material, the first interconnections and second interconnections separated by an interlayer insulating material, first contacts and second contacts on sidewalls of the interlayer insulating material and separated by the interlayer insulating material, third interconnections and fourth interconnections over the interlayer insulating material and configured as an iRDL, and compensation capacitors. The compensation capacitors comprise lower electrodes over the interlayer insulating material, dielectric materials over the lower electrodes, and upper electrodes over the dielectric materials. The lower electrodes comprise edge portions in contact with the second contacts. A portion of the third interconnections over the dielectric materials of the compensation capacitors are configured as the upper electrodes of the compensation capacitors.

Accordingly, a method of forming an apparatus is disclosed. The method of claim comprises forming a lower electrode over an interlayer insulating material over a base material, which comprises first interconnections and second interconnections thereon. A patterned dielectric material is formed over the lower electrode and trenches are formed in the interlayer insulating material to expose the first interconnections and the second interconnections. An electrically conductive material is formed over the patterned dielectric material and in the trenches. A portion of the electrically conductive material is removed to form an upper electrode over the patterned dielectric material, the lower electrode, the patterned dielectric material, and the upper electrode comprising a compensation capacitor.

Figure 29:
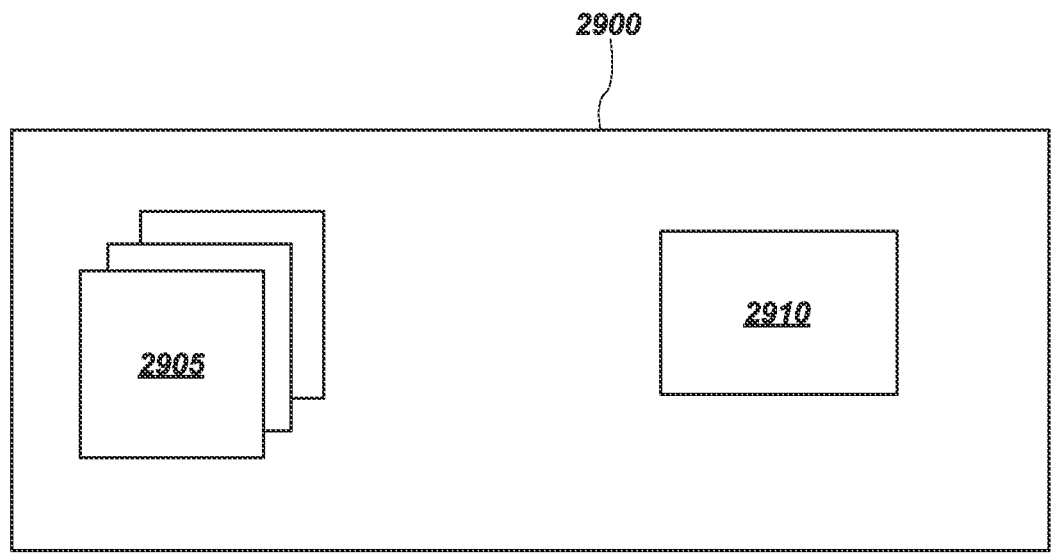
FIG. 29 is a schematic block diagram illustrating a memory device including one or more of the semiconductor devices in accordance with embodiments of the disclosure.

The semiconductor devices 100, 100', 100'', 100''', 100'''' according to embodiments of the disclosure may be used in a memory device 2900 that includes a memory array 2905 of memory cells. The memory device 2900 (e.g., a DRAM device) is shown schematically in the functional block diagram of FIG. 29. The memory device 2900 includes the memory array 2905 of memory cells including one or more semiconductor devices 100, 100', 100'', 100''', 100'''' and a control logic component 2910. The control logic component 2910 may be configured to operatively interact with the memory array 2905 so as to read, write, or re-fresh any or all memory cells within the memory array 2905.

Accordingly, a memory device comprising a memory array comprising memory cells and a control logic component operably coupled to the memory array is disclosed. At least one of the memory cells comprises first interconnections and second interconnections spaced apart from one other. An interlayer insulating material is over the first interconnections and second interconnections. First contacts and second contacts are in the interlayer insulating material and spaced apart from one other. Third interconnections and fourth interconnections are over the interlayer insulating material and spaced apart from one another, the third interconnections coupled with the first interconnections through the first contacts, and the fourth interconnections coupled with the second interconnections through the second contacts. Compensation capacitors in a capacitor region comprise lower electrodes over the interlayer insulating material, dielectric materials over the lower electrodes, and upper electrodes over the dielectric materials. The lower electrodes comprise edge portions in contact with the second contacts. The third interconnections are elongated over the dielectric materials of the compensation capacitors, which are configured to provide elongated portions as the upper electrodes of the compensation capacitors.

Figure 30:
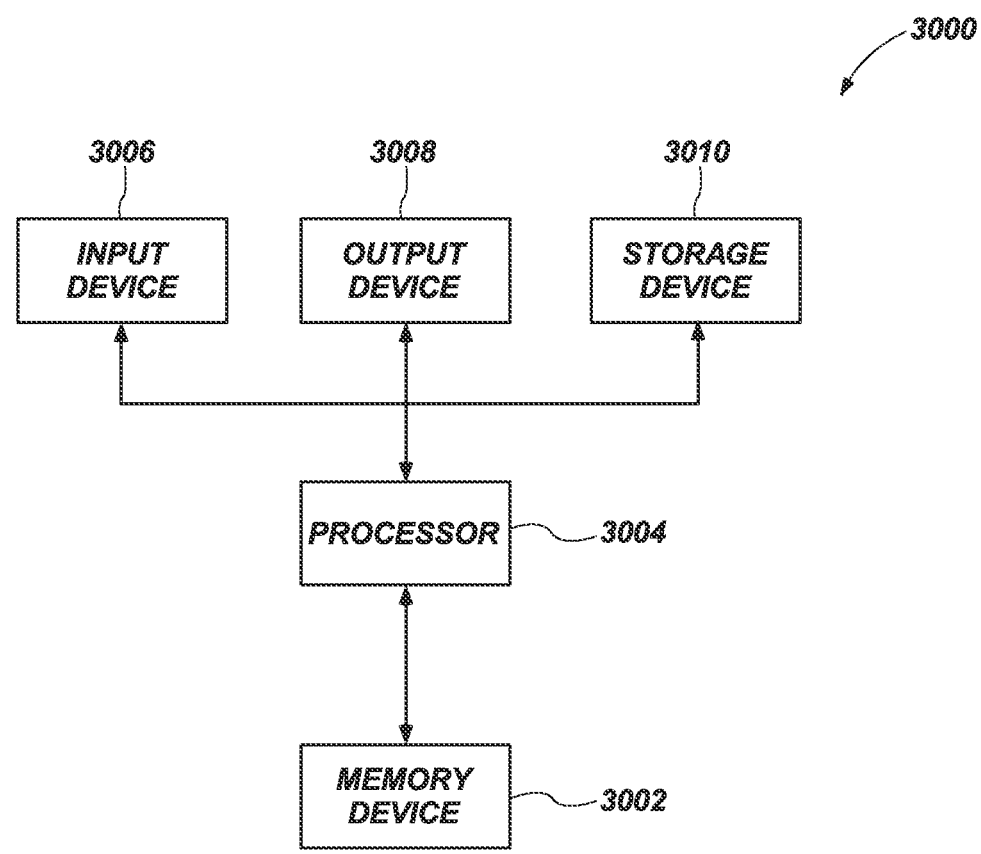
FIG. 30 is a schematic block diagram illustrating a system including one or more of the semiconductor devices in accordance with embodiments of the disclosure.

A system 3000 is also disclosed, as shown in FIG. 30, and includes the semiconductor devices 100, 100', 100'', 100''', 100''''. FIG. 30 is a simplified block diagram of the system 3000 implemented according to one or more embodiments described herein. The system 3000 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The system 3000 includes at least one memory device 3002, which includes memory cells including one or more semiconductor devices 100, 100', 100'', 100''', 100'''' as previously described. The system 3000 may further include at least one processor device 3004 (often referred to as a "processor"). The processor device 3004 may, optionally, include one or more semiconductor devices 100, 100', 100'', 100''', 100'''' as previously described. The system 3000 may further include one or more input devices 3006 for inputting information into the electronic system 3000 by a user, such as, for example, a mouse or other pointing device, a keyboard, a touchpad, a button, or a control panel. The electronic system 3000 may further include one or more output devices 3008 for outputting information (e.g., visual or audio output) to a user such as, for example, a monitor, a display, a printer, an audio output jack, a speaker, etc. In some embodiments, the input device 3006 and the output device 3008 may comprise a single touchscreen device that can be used both to input information to the electronic system 3000 and to output visual information to a user. The one or more input devices 3006 and output devices 3008 may communicate electrically with at least one of the memory device 3002 and the processor device 3004. The system 3000 may further include one or more storage devices 3010.

Accordingly, an electronic system comprising a processor device operably coupled to an input device and an output device and a memory device operably coupled to the processor device is disclosed. The memory device comprises memory cells, at least one of which comprises first interconnections and second interconnections separated by an interlayer insulating material, first contacts and second contacts in the interlayer insulating material and separated by the interlayer insulating material, third interconnections and fourth interconnections over the interlayer insulating material and separated from one another, the third interconnections coupled with the first interconnections through the first contacts, and the fourth interconnections coupled with the second interconnections through the second contacts. Compensation capacitors are between the third interconnections and fourth interconnections and comprise lower electrodes over the interlayer insulating material, dielectric materials over the lower electrodes, and upper electrodes over the dielectric materials, the lower electrodes comprising edge portions in contact with the second contacts. The third interconnections are configured to provide elongated portions as the upper electrodes of the compensation capacitors.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus comprising:
an interlayer insulating material directly contacting first interconnections and second interconnections, the first interconnections and the second interconnections spaced apart from one other;
first contacts and second contacts in the interlayer insulating material;
third interconnections and fourth interconnections configured as an integrated redistribution layer, the third interconnections coupled with the first interconnections by the first contacts, and the fourth interconnections coupled with the second interconnections by the second contacts; and compensation capacitors in capacitor regions, the compensation capacitors comprising lower electrodes over the interlayer insulating material, dielectric materials over the lower electrodes, and upper electrodes over the dielectric materials, the lower electrodes comprising edge portions in contact with the second contacts, wherein the third interconnections are elongated over the dielectric materials of the compensation capacitors to provide elongated portions as the upper electrodes of the compensation capacitors.

2. The apparatus of claim 1, wherein the compensation capacitors are in a wiring region.

3. The apparatus of claim 1, wherein a lower edge of the lower electrodes and a lower edge of the dielectric materials contact the second contacts.

4. The apparatus of claim 1, wherein the upper electrodes comprise titanium, aluminum, and titanium nitride.

5. The apparatus of claim 1, wherein the upper electrodes are separated from the fourth interconnections.

6. The apparatus of claim 1, wherein the third interconnections and the fourth interconnections are separated from one another.

7. The apparatus of claim 1, wherein the first contacts and the second contacts are on sidewalls of the interlayer insulating material and the first interconnections and the second interconnections are below the first contacts and the second contacts.

8. An apparatus comprising:
first interconnections and second interconnections on an insulating material, the first interconnections and the second interconnections laterally separated from one other;
an interlayer insulating material directly contacting the first interconnections, the second interconnections, and the insulating material;
first contacts and second contacts in the interlayer insulating material;
third interconnections and fourth interconnections on the interlayer insulating material and configured as an integrated redistribution layer; and
compensation capacitors in capacitor regions, the compensation capacitors comprising lower electrodes over the interlayer insulating material, dielectric materials over the lower electrodes, and upper electrodes over the dielectric materials, the lower electrode comprising edge portions in contact with the second contacts,
wherein the third interconnections are elongated over the dielectric materials of the compensation capacitors to provide elongated portions as the upper electrodes of the compensation capacitors.

9. The apparatus of claim 8, wherein the dielectric materials contact upper surfaces of the interlayer insulating material in the capacitor regions and external to the capacitor regions.

10. The apparatus of claim 8, wherein the dielectric materials contact upper surfaces of the interlayer insulating material only in the capacitor regions and directly adjacent to the capacitor regions.

11. The apparatus of claim 8, wherein lateral edges of the dielectric materials and the lower electrodes contact the second contacts.

12. The apparatus of claim 8, wherein the capacitor regions are located between the third interconnections and the fourth interconnections.

13. The apparatus of claim 8, wherein portions of the lower electrodes are external to the capacitor regions.

14. An apparatus comprising:
first interconnections and second interconnections over a base material;
an interlayer insulating material over the base material and between the first interconnections and the second interconnections;
first contacts and second contacts within the interlayer insulating material and spaced apart from one another by the interlayer insulating material;
third interconnections and fourth interconnections over the interlayer insulating material and spaced apart from one another, the third interconnections coupled with the first interconnections by the first contacts and the fourth interconnections coupled with the second interconnections by the second contacts; and
compensation capacitors comprising lower electrodes over the interlayer insulating material, dielectric materials over the lower electrodes, and upper electrodes over the dielectric materials, a portion of the third interconnections over the dielectric materials of the compensation capacitors configured as the upper electrodes of the compensation capacitors;
wherein the lower electrodes of the compensation capacitors contact the fourth interconnections but do not contact the third interconnections.

15. The apparatus of claim 14, wherein edges of the lower electrodes and edges of the dielectric materials contact the second contacts.

16. The apparatus of claim 15, wherein edges of the dielectric materials contact the first contacts.

17. The apparatus of claim 14, wherein first ends of the lower electrodes overlap with the second interconnections and second ends of the lower electrodes are spaced apart from the first interconnections.

18. The apparatus of claim 14, wherein first ends of the lower electrodes are vertically adjacent to the second interconnections and second ends of the lower electrodes are vertically adjacent to a portion of the interlayer insulating material between the first interconnections and the second interconnections.

19. The apparatus of claim 14, wherein the upper electrodes are separated from the fourth interconnections.

20. The apparatus of claim 14, wherein the lower electrodes and dielectric materials are in capacitor trenches in the interlayer insulating material.

* * * * *